(12) United States Patent
Evans et al.

(10) Patent No.: US 6,661,825 B2
(45) Date of Patent: Dec. 9, 2003

(54) INTEGRATED GRATING-OUTCOUPLED SURFACE-EMITTING LASERS

(75) Inventors: Gary A. Evans, Plano, TX (US); Jay B. Kirk, Plano, TX (US); John Mattis, Allen, TX (US)

(73) Assignee: Photodigm, Inc., Richardson, TX (US)

( * ) Notice: Subject to any disclaimer, the term of this patent is extended or adjusted under 35 U.S.C. 154(b) by 0 days.

(21) Appl. No.: 09/947,215

(22) Filed: Sep. 4, 2001

(65) Prior Publication Data

US 2002/0086454 A1 Jul. 4, 2002

Related U.S. Application Data

(60) Provisional application No. 60/230,534, filed on Sep. 1, 2000.

(51) Int. Cl.[7] .............................. H01S 5/18; H01S 5/12
(52) U.S. Cl. ............................ 372/50; 372/96; 372/102
(58) Field of Search ....................... 372/45, 50, 96, 372/102

(56) References Cited

U.S. PATENT DOCUMENTS

| | | | |
|---|---|---|---|
| 5,111,467 A | 5/1992 | Bradley | 372/32 |
| 5,131,001 A * | 7/1992 | Carlson | 372/50 |
| 5,164,956 A | 11/1992 | Lang | 372/96 |
| 5,283,447 A | 2/1994 | Olbright et al. | 257/85 |
| 6,246,708 B1 | 6/2001 | Thornton et al. | 372/50 |
| 6,459,715 B1 * | 10/2002 | Khalfin et al. | 372/50 |
| 6,477,285 B1 * | 11/2002 | Shanley | 385/14 |

OTHER PUBLICATIONS

Hagberg et al., "Investigation of High–Efficiency Surface–Emitting Lasers with Blazed Grating Outcouplers", IEEE Journal of Quantum Electronics, vol. 32, No. 9, Sep. 1996, pp. 1596–1605.

* cited by examiner

*Primary Examiner*—James Davie
(74) *Attorney, Agent, or Firm*—Duke W. Yee; Stephen J. Walder, Jr.

(57) ABSTRACT

An electronic/photonic integrated circuit in which grating-outcoupled surface-emitting lasers are used both to provide external emission out of the plane of the chip (through gratings), and also to feed optical power into photonic waveguides parallel to the plane of the chip. Transistors are fabricated in a common multilayer semiconductor body with the lasers.

14 Claims, 11 Drawing Sheets

US 6,661,825 B2

INTEGRATED GRATING-OUTCOUPLED SURFACE-EMITTING LASERS

CROSS-REFERENCE TO OTHER APPLICATION

This application claims priority from 60/230,534, filed Sep. 1, 2000, which is hereby incorporated by reference.

BACKGROUND AND SUMMARY OF THE INVENTION

The present invention relates to Electronic/Photonic Integrated Circuits, in which optical emitters are integrated with complex integrated circuitry.

Background: Integration of Emissive Electro-Optics

Vast advances have been made in integrated circuit electronics over the last few decades. At the same time, the technology of solid-state lasers has advanced greatly, and such lasers have proven useful in many applications. However, there has been no successful merger of these technologies, and the two have continued to develop along generally separate paths.

Imagers are inherently much simpler to integrate than emissive optics. (Indeed, in the last few years CMOS imagers, which use basically mainstream CMOS technology, have largely displaced even CCD imagers.) Many chips and hybrids have combined an imaging array with drivers or other associated circuitry.

Emissive optics, however, have been much more intractable to integration. Various attempts have been made to propose a technology which would combine emissive optics with complex integrated electronics, but no such proposal has come remotely close to practicability.

Thus while there is a great need for a fully integrated emissive Electro-Photonic Integrated Circuit ("EmEO") technology, there has been no adequate solution to this need.

Background: GSE Lasers

The Grating-Outcoupled Surface-Emitting (GSE) laser (described in commonly assigned U.S. patent application Ser. Nos. 09/844,484 and 09/845,029, both of which are hereby incorporated by reference), is an essentially planar structure which provides out-of-plane optical emission. The GSE laser has a built in horizontal waveguide that allows on-wafer or on-chip routing and control of light along with emission from the surface of the wafer or chip. In contrast, the light from vertical cavity surface-emitting lasers (VCSELs) is directed normal to the wafer or chip surface and cannot easily be routed within the wafer or chip. The epitaxial structure of a VCSEL is very thick and therefore costly and time consuming to grow, compared to the relatively thin layers making up an edge-emitting (EE) or GSE laser. While EE lasers have a horizontal waveguide and can route light within a wafer or chip, at least one terminating edge (cleaved or etched) is required to access or connect the on-chip light to the outside world. Thus EE lasers are inherently edge-bound (and hence not fully integrable), while VCSELs have incompatibility due to their very special epitaxy requirements.

Integrated Grating-Outcoupled Surface-Emitting Lasers

The present inventors have realized that GSE laser technology provides the foundations for an economical and fully integrable emitter structure, and for a new Emissive Electro-Optic Integrated Circuit technology in which optical emitters (and possibly other optical components) are integrated with complex integrated circuitry. This provides a technology in which on-chip photonic signal channels are combined with unconstrained location of photonic output or input couplers to the outside world. Preferably distributed reflectors are used to define the on-chip laser cavities, so that the locations of laser cavities are not tied to wafer edge or facet locations.

It is highly preferred, in many embodiments, that the optical gain volume (of the emissive photonic elements) and the conductivity-modulation volume (of the active electronic elements) should be formed using a SINGLE body of semiconductor material. Many approaches have been proposed for hybrid structures and for modules, but all have proven to present substantial technological difficulties.

The disclosed innovations, in various embodiments, provide one or more of at least the following advantages:

- capability for on-chip routing of optical signals;
- combined capability for both on-chip routing and third-dimensional outcoupling of optical signals;
- the manufacturing difficulties of faceted wafers are avoided; and
- the expensive epitaxy of vertical-cavity lasers is avoided.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 7b shows a close up of the crossed gratings for the laser system of FIG. 7a.

DETAILED DESCRIPTION OF THE PREFERRED EMBODIMENTS

The numerous innovative teachings of the present application will be described with particular reference to the presently preferred embodiment (by way of example, and not of limitation).

Figure 8:
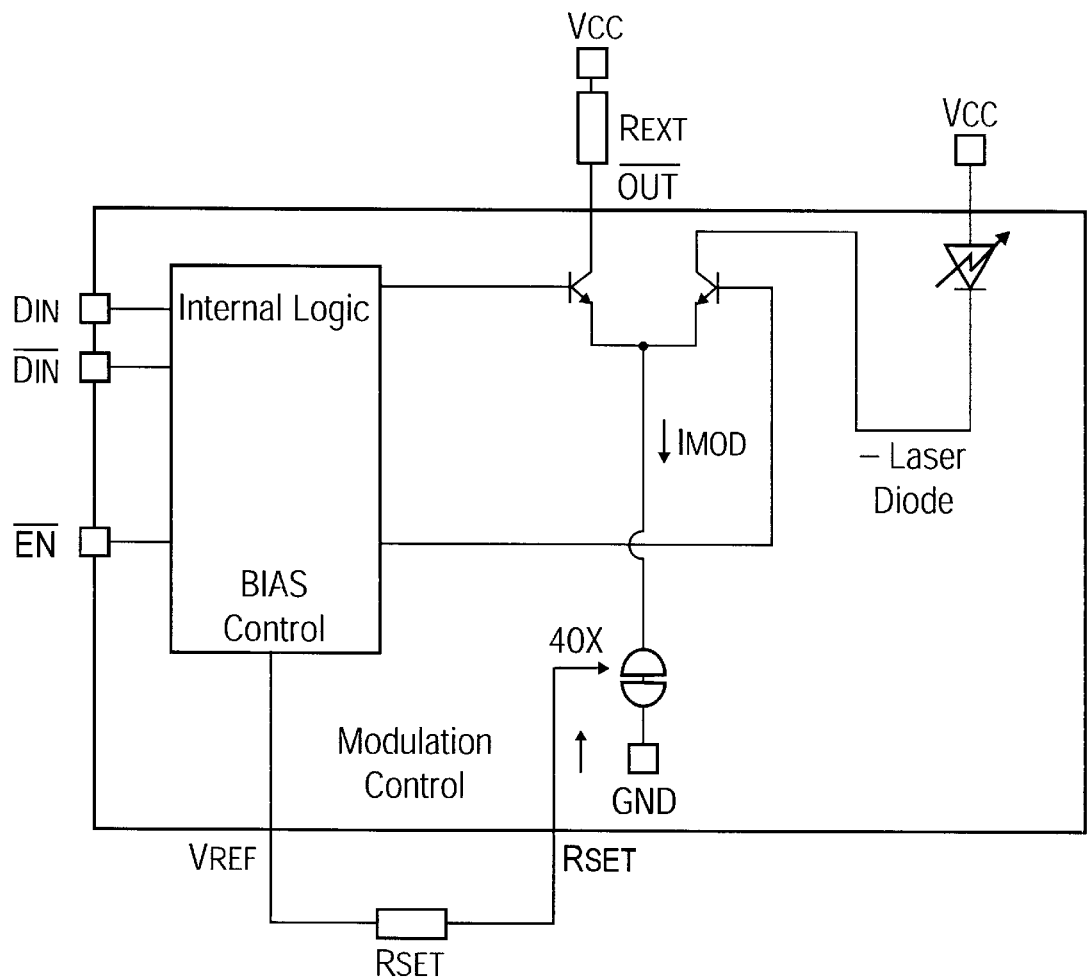
FIG. 8 shows a circuit diagram of integrated elements with the presently disclosed laser system.

FIG. 8 shows an example of a higher level circuit integration on the same chip as the grating outcoupled laser diode. In this example, laser driver and control electronics are integrated. Din and Din-bar are differential data inputs and EN is the chip enable. Internal logic and BIAS control is used to center the data to the inputs of the driver pair and to provide a Vref output. This output is used with Rset to control the current source or modulation current Imod which sets the output current to the grating outcoupled laser diode. The resistor Rext is external to minimize the power dissipation capacity, both Rext and Rset may be integrated as well.

Figure 9:
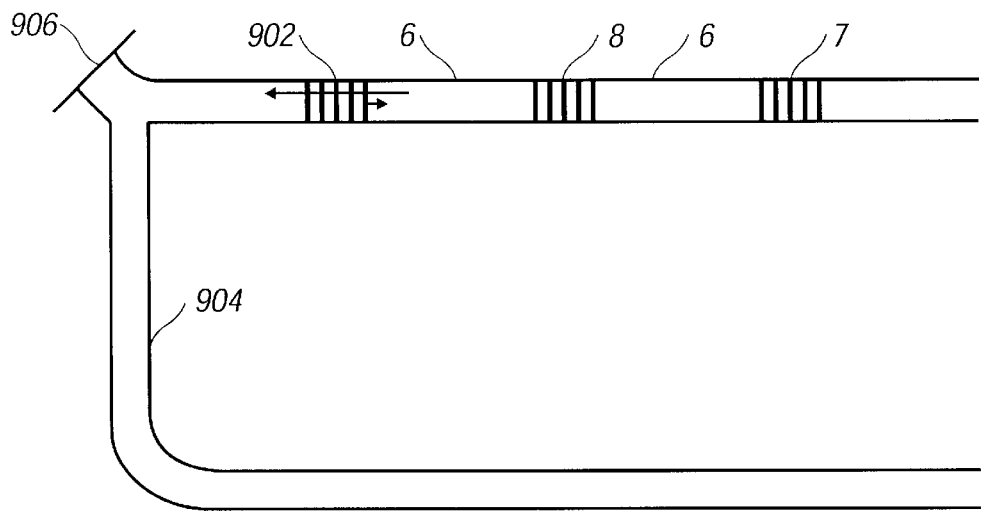
FIG. 9 shows optical waveguides routing light from the laser to other elements.

FIG. 9 shows the optical waveguide technology routing the light from the laser source to another integrated circuit component, for example. One end of the laser has a partially transmitting reflector 902 which allows some of the light to pass through. This light is guided by a waveguide 904 to another circuit element as desired for any given application. In the example shown, a corner turning mirror 906 is used to guide the light.

Figure 10:
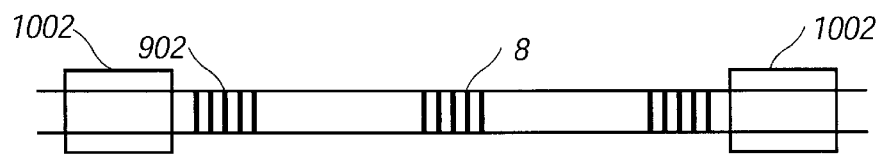
FIG. 10 shows a possible configuration for integrated elements with a laser diode.

Other devices can also be integrated on the same chip with the innovative laser system of the present application. FIG. 10 shows a grating outcoupled laser diode with the OCG 8 between the two reflectors 902 at either end of the cavity. One or both reflectors are partially transmitting gratings in this example. In this variation, a waveguide coupler, which may be used for connecting to other integrated devices, is located outside the laser cavity. A location for such an integrated device 1002 is shown at either end of the cavity. Of course, other devices could also be integrated, for example, modulators or tuning sections.

Figure 11:
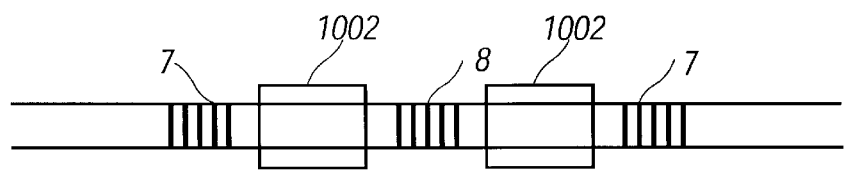
FIG. 11 shows another possible configuration for integrating added elements to the present innovations.

FIG. 11 shows another possible variation for integrating added components (such as a phase adjustor, for example). In this example, two regions 1002 where added devices may be fabricated on chip are shown. In this example, the added components are located within the length of the laser, possibly requiring the gain region contacts to be moved or altered to accommodate the added device.

Details and Alternatives for Laser Design and Fabrication

Preferred implementations of photonic elements will now be described, as well as a wide variety of modifications.

First order outcoupling gratings and second order or higher outcoupling gratings are both used in at least some embodiments of the present innovations. In the present application, first order DBR refers to a distributed Bragg reflector grating that reflects light within the waveguide in first order for feedback. A second order DBR grating will outcouple light in first order, and feedback light in second order.

In several variations in this application, second order feedback gratings (which couple light out in first order ) are used. In such arrangements, the feedback grating depth or strength is varied in the y and z directions so that both the loss and the feedback from the grating help to stabilize the laser mode. For example, the first order lateral mode will be stabilized if the grating strength is varied so that the feed back varies like a Gaussian. This is accomplished by forming the grating so that its strength varies as $$1-\exp[-(y/\omega)^2]$$

where y is the direction parallel with the feedback grating surface and perpendicular to the cavity length, with the origin taken to be at the center of the out-coupling grating, and omega is half the y grating dimension.

First order outcoupling gratings are gratings which couple light out of the waveguide plane in first order but may or may not satisfy the in-plane Bragg condition for second or higher order Bragg reflection. Such gratings may be designed to create no second or higher order reflections which feedback into the laser mode. In these variations which use such out-coupling gratings with no in-plane feedback, the gratings cause no destabilizing feedback into the laser mode and are mechanically and electrically isolated from the structure used to form and pump the resonant laser cavity. Thus, the length and position of the output grating can be chosen to suit the needs of the application for which the laser is designed. The grating periods required for outcoupling, with and without in-plane reflections, are summarized in "Surface Emitting Semiconductor Lasers and Arrays," G. A. Evans and J. M. Hammer, Eds., Academic Press, 1993, which is hereby incorporated by reference.

In general, second and higher order feedback gratings can result in some outcoupling. However, these are less preferred in the context of the present application since such higher order interactions are less efficient.

The outcoupling angle of the gratings in the innovative systems herein disclosed is measured as an angle from the normal to the surface of the outcoupling grating. Resonant outcoupling occurs when the outcoupling grating has a period that is equal to an integer number of wavelengths of the light in the cavity. A grating with period equal to the wavelength of light in the laser cavity will outcouple some light normal to the laser plane and reflect some light in-plane in second order. This means the light exits the grating parallel or nearly parallel to the normal. Outcoupling of light off the normal occurs when the grating is not an integer number of guide wavelengths, and in such a case the light exits the grating at an angle from the normal. This angle depends on the difference between the guide wavelength and the grating period. Varying the wavelength of light or the outcoupling grating period can therefore have great effect on the angle of outcoupled light. The out-coupling grating length, longitudinal position, and the output angles may therefore be chosen over a large range of values. The grating may also be shaped to achieve an output beam of a desired cross section. This is valuable for coupling the output light into fibers of different cross sectional size or at different angles than exactly or nearly normal. All of these "off normal" parameters may be varied without fear of significant mode destabilization or disruption of laser coherence. In the case of exactly or near normal outcoupling, there can be significant in-plane reflection that may (or may not) adversely affect the performance of the laser.

Figure 1A:
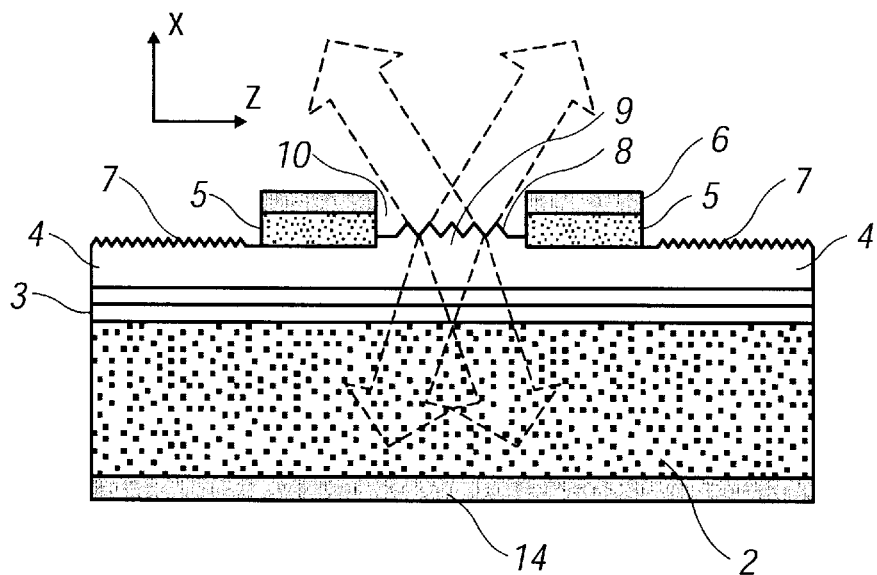
FIG. 1a shows side view of a GSO+DBR laser.

FIG. 1a shows a cross sectional view of a preferred embodiment, taken to show the x-z plane. It should be understood that the features in the several figures may not be to exact scale because of the large differences in dimension between the various structures illustrated.

Layers 3, 4, 5, and 6 are grown on a substrate 2 by known means. Each of these layers may comprise a number of sub-layers. Beneath the substrate is the n contact layer 14. The substrate may comprise a thick layer of n-type semiconductor with a top layer of similar n-type material interposed beneath layer 3. This is frequently called the n-cladding or n-clad. The n-clad will have a refractive index below that of layer 3. Layer 3 is the active and guiding layer usually containing the junction between p- and n-type semiconductor materials. It may comprise, for example, a sequence of one or more barrier layers alternating with quantum well layers. Layer 4 is a p-type clad layer and has lower refractive index than layer 3. Layer 5 may be a multi-layer including a p-clad material chosen to enable good contact to 6 which is the p-metallic contact. Layer 14 provides the other electrical contact for the laser. There are many sequences of possible layers for semiconductor lasers and amplifiers, and the present innovations are not limited to the structures recited here. For example, a structure with a p-type rather than an n-type substrate (and all the necessary alterations to accommodate a change from p- to n-type materials and vice versa) is within the contemplation of the present application.

Gratings 7 are surface relief DBR gratings chosen to reflect light in the +/−z direction to form the laser cavity. (Note that these gratings can be buried structures within the device, and the term "surface relief" does not require the grating be on the surface of the device after processing.) The laser mode will be a standing wave which may be considered to be formed by two waves one flowing in the +z direction, the other in the −z direction. First order DBR gratings are preferred, but second or higher order gratings are also possible. The DBR grating depth and length and the thickness of layer 4 are chosen to provide the desired feedback as known in the art.

The reflector gratings can be given added functionality by varying their grating strength or amplitude in both the y (lateral) direction and the z (cavity) direction. Variation of the grating strength in the lateral direction will impart to the cavity mode light a Gaussian shape, allowing for more of the optical energy of the emitted light to be coupled into a circular mode, such as a fiber. Variation of the grating strength in the z direction can improve the suppression of unwanted longitudinal modes on either side of the desired longitudinal mode. (The degree to which the unwanted modes are suppressed is called the side-mode suppression ratio.)

The outcoupling grating 8 (sometimes referred to herein as OC grating, or OCG) is a surface relief grating with period chosen to couple light at desired angles from the grating plane. It is located at an aperture on the surface of the device. In a preferred embodiment, the outcoupling gratings are about 10 microns wide. The outcoupling grating may be shaped to control the shape of the emitted beam. The grating depth and thickness of the p-clad layer 9 in the vicinity of the grating 8 are chosen to provide the desired degree of outcoupling and to control beam shape. A window or aperture 10 in layers 5 and 6 is provided to allow unobstructed emission of light, and the size and shape of the outcoupling grating is matched to the mode of the fiber to which it couples light (in one embodiment). Because of the two standing waves in the cavity and reflection from the grating, the outcoupling grating simultaneously emits four different light beams, two above and two below the grating plane. These are depicted by dashed arrows. In the case of normal outcoupling of the laser light, the two top lobes are combined into a single beam, as are the two bottom lobes of emitted light.

In one embodiment, the outcoupled light is emitted normal to the surface, since one primary goal is to couple this light into a fiber. When light is emitted normal to the surface, the two top emitted beams are combined into a single beam, and likewise with the downward emitted beams.

Off normal emissions and slightly off normal emissions are also very useful. For example, changing the angle of entry to a fiber by several degrees has minimal impact on the coupling efficiency yet allows the use of an off resonance grating which minimizes undesired feedback into the laser. A larger angle might be desirable to send light to another detector to monitor the laser.

Figure 1B:
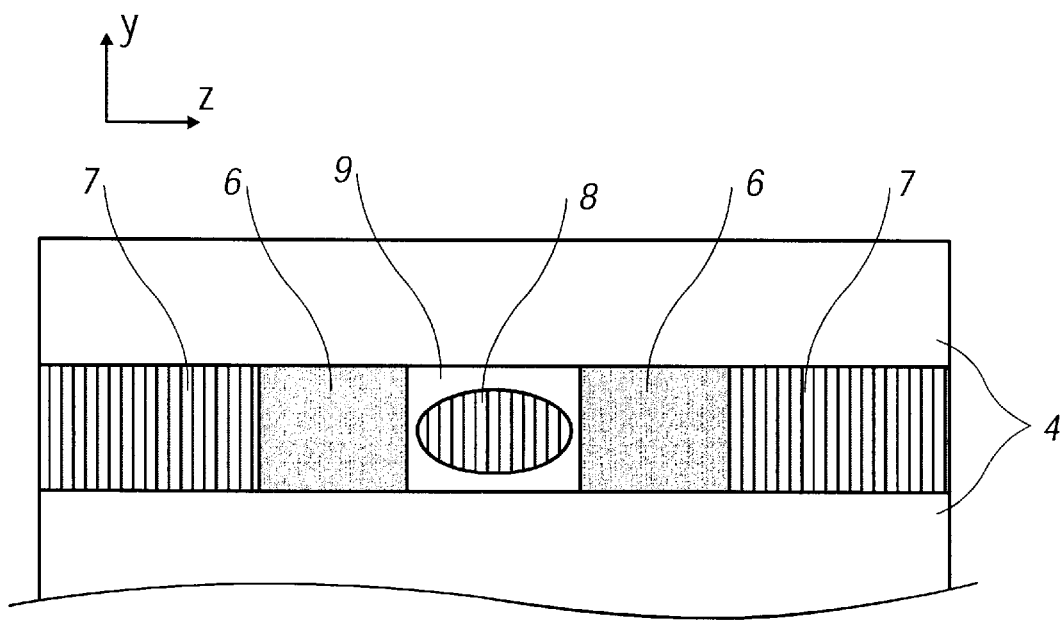
FIG. 1b shows a top view.

FIG. 1b shows a top view of a single grating outcoupled DBR laser. The outcoupling grating 8 is located at an outcoupling aperture within the envelop of the gain region. On either end of the laser are located distributed Bragg reflectors 7 for providing feedback into the cavity. Of course, cleaved facets may also be used instead of reflector gratings, with highly reflective coatings applied to reflect the light, as shown in later embodiments. With either DBR reflectors or coated facets, the reflectivity of one or both ends can be varied to allow light to escape the cavity for other purposes.

Another embodiment will be discussed with reference to FIGS. 2a and 2b. In this variation, crossed out-coupling gratings are located within the cavities of two (or more) semiconductor lasers arranged at angles to one another and located on a common substrate. In one embodiment, two lasers are used and are positioned at 90 degrees from one another, but more lasers are of course possible—see FIG. 7a for example. The shape and strength of the two gratings are chosen to produce desirable properties in the out-coupled light. Their periods are individually chosen to suit the desired application, such as to control outcoupling angle, or to couple out different wavelengths.

Figure 2A:
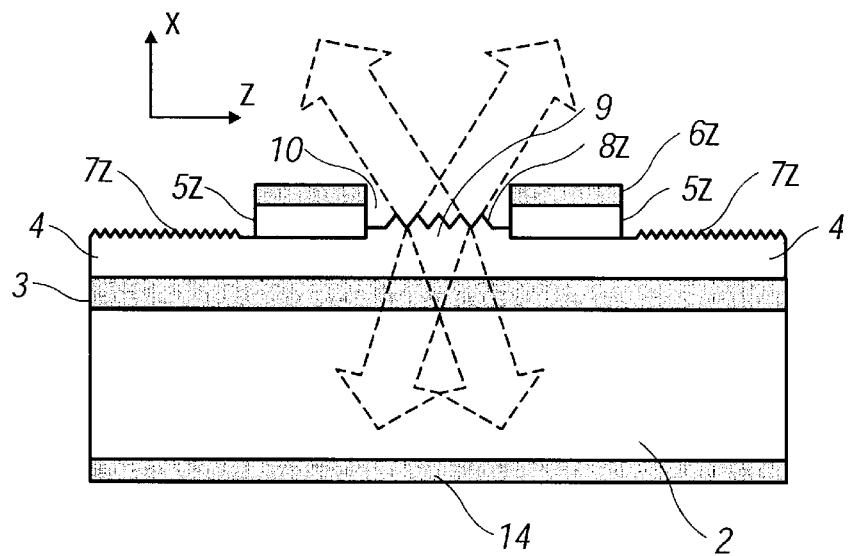
FIG. 2a shows a side view of crossed DBR lasers.

FIG. 2a shows a side view of the crossed grating outcoupled DBR lasers. The structure when seen from the side is similar to that of FIG. 1. Elements that are unique to the laser running in the z-direction are labeled with a z suffix, and elements unique to the laser running in the y-direction are labeled with a y suffix.

Figure 2B:
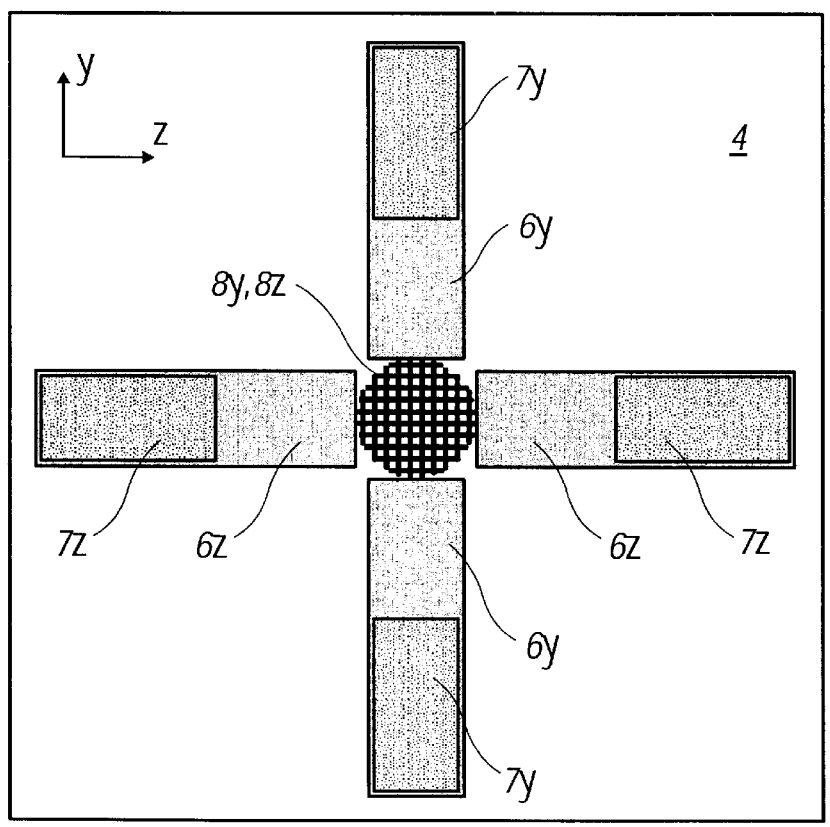
FIG. 2b shows a top view.

Referring to FIG. 2b, a top view, two crossed DBR lasers are at 90 degrees to one another. Each laser has its own set of reflector gratings 7y, 7z at either end, and both lasers have their own out-coupling grating 8y, 8z positioned at a common location between the reflector gratings. (In the preferred embodiment, the outcoupling aperture is located at the center of the laser, but this is not necessary.) On either side of the out-coupling gratings are the pumped regions of the lasers. (Note that in this variation, the two gain regions of a single laser are discontinuous, having different parts on either side of the outcoupling grating. Other possible embodiments include a single gain region with an outcoupling grating outside the gain region but between the reflector gratings, or even a single continuous gain region that spans the outcoupling grating, having portions on both sides.) The two out-coupling gratings are located at the same place, and the superposition of the two gratings forms a virtual grating with an effective period at an angle of about 45 degrees if the grating periods are about the same fore each laser.

The reflector grating periods are chosen to internally reflect the proper wavelength of light. The reflectivity of the DBR is very high at the Bragg condition, and drops off rapidly when the wavelength is different than the Bragg condition wavelength. This allows the wavelength of the output light to be controlled by controlling the period of the DBR gratings.

Referring again to FIG. 2a, in the case of crossed lasers, a cross section taken parallel to the x-y plane would be similar with layers noted with y subscripts in place of z subscripts.

Gratings 8y and 8z are surface relief outcoupling gratings with periods chosen to couple light at desired angles relative to the grating (y-z) plane. As shown in the figure, the gratings can be shaped to control the profile of the out-coupled beam. A circular profile for the grating is indicated (a more complicated profile would be optimal for fiber coupling), but any other useful shape can be produced, depending on the application. The grating depth along with the thicknesses and compositions of the epitaxial structure of the laser are chosen to provide the desired degree of out-coupling.

For each laser, four beams are emitted because of the left and right running waves that form the standing wave mode of the laser (unless the light is outcoupled perpendicular to the device). Two beams symmetrically angled around the normal will emerge above the grating plane and pass through the window 10. Similarly, two beams will be directed towards the substrate below. (Note the epi layers are transparent and this transparency can be made use of to couple light out through the bottom of the device. In such a case, a reflector is placed on the top of the device to direct the top emitted light back into the laser or out the bottom.) In some designs, the grating may be blazed to allow light to be outcoupled to the right or left of normal as well.

When two or more lasers are combined in this way, the crossed outcoupling gratings each polarize the light which they outcouple. In the case of two crossed gratings at 90 degrees, the two beams of light will be polarized at 90 degrees with respect to one another. Coupling light into a fiber with two orthogonal polarizations is required for pumping Raman amplifiers.

Figure 2C:
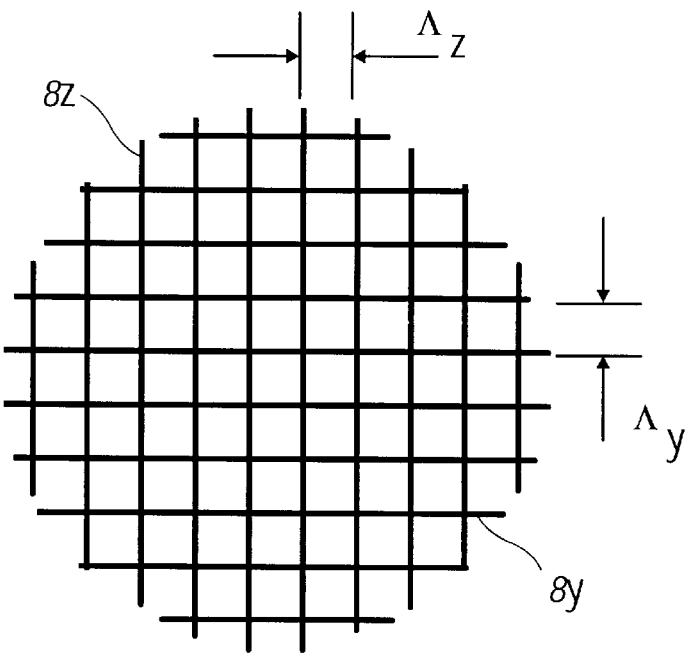
FIG. 2c shows a close up of crossed outcoupling gratings.

FIG. 2c shows a close up of the outcoupling gratings of FIGS. 2a and 2b. The periods, Ly and Lz, of the superimposed two gratings need not be identical. The OCG periods will depend both on the wavelength of light in the cavity (which in turn depends on the periods of the DBR gratings at either end of the cavity) and on the desired outcoupling angle for the emitted beam. By choosing the two gratings to have different OC angles, spatial separation is possible, as may be desired by particular applications. In still another embodiment, the laser light from the devices is emitted normal to the surface, so that both wavelengths of light can be coupled into a fiber through the same aperture or location on the device.

By choosing a non-resonant spacing for the outcoupling grating period (i.e., a distance between grating lines that is not an integer multiple of the wavelength of light within the cavity) the output beams are emitted non-normal to the surface. This is useful in applications where, for example, the fiber into which the light is to be coupled is at an angle relative to the out-coupling grating.

The choice of normal or off normal outcoupling angles can have other advantages. For example, when two or more different wavelengths of light are coupled out of the OC gratings, all wavelengths can be coupled into the same fiber or separated as desired by varying the output angles of the individual gratings. For example, the individual outcoupling gratings for two crossed devices could each couple different wavelengths of light out normal to the surface to couple two different wavelengths into a single fiber mode. This is particularly applicable in the crossed grating out-coupled lasers, discussed further below. If, for some reason, only one wavelength is needed in the fiber, the light from the other device can be emitted off normal so as to not couple into the fiber. The non fiber coupled light could be deflected to a detector, for example. Regardless of the particular use, the choice of outcoupling angles is an advantage to a laser device, and the present application shows how different wavelengths from different sources can be selectively combined into a single region for coupling, or separated into different regions.

The shape and strength (i.e., the depth) of the OC gratings are chosen to produce desirable properties in the out-coupled light. The periods of all OC gratings can be individually chosen according to the needs of that particular laser and the application. For example, the two crossed OC gratings of FIG. 2b can be chosen to outcouple different wavelengths of light, allowing the two lasers of the crossed laser configuration to have different wavelengths, one in the z-direction, another in the y-direction. This of course extrapolates to higher numbers of lasers. Additionally, the two outcoupling gratings (and the different laser diodes themselves) can be chosen to emit the same wavelengths (for example, by making their feedback grating periods the same) allowing additional power and polarization variety in the outcoupled beam(s).

The basic idea can be extended to include a multiplicity of lasers radially arranged around a set of gratings oriented to outcouple light independently for each laser. This allows many wavelengths of light to be generated by merely choosing a different period for the pair of DBRs for each individual laser. The OC gratings can couple this light into a single spatial region (for example, to couple several wavelengths of light into a fiber for DWDM applications), or it can couple the different wavelengths out of the devices at different angles.

Referring still to FIG. 2b, which shows crossed lasers according to a preferred embodiment, if the Bragg reflector gratings are chosen to have the same period in both the y-direction laser and the z-direction laser so that both lasers operate at the same wavelength, and if the crossed OC grating period Lz is the same as Ly, the superposition of the two gratings at right angles results in a virtual grating with an effective period angle of about 45 degrees (if both grating periods are the same). In this case the possible coupling between the y and z lasers can be avoided if the gain regions use quantum wells with compressive strain and thus favor TE mode operation. The virtual grating at 45 degrees will not efficiently reflect TE modes and therefore will not couple the y and z lasers. On the other hand, the use of tensile strain in the quantum well favors TM modes, and may result in enough coupling to either lock the y and z lasers together into a single coherent source, or provide significant cross-talk and other interactions between the two lasers. Thus, the disclosed approach can choose the nature of the output beams to be either a combined single frequency coherent source, or two output beams with two independent wavelengths, or two beams with independent wavelengths but with a controlled amount of crosstalk between them.

The reflector grating periods for the pair of lasers can be the same, which provides additional power and polarization variety. Alternatively, the grating periods can be different, resulting in two different wavelengths of light being outcoupled. This latter configuration can couple light of different wavelengths out at the same angle for coupling light of different wavelengths into the same fiber, saving the cost of implementing a combiner for this function. For example, if the two lasers have different feedback grating periods, they will each generate a different wavelength of light. But both lasers can emit their light normal to the surface of their respective outcoupling grating by choosing each individual outcoupling grating to couple the necessary wavelength of light out normal to the surface.

The size of the grating output aperture can be adjusted for optimum coupling to single or to multi-mode fiber.

Likewise, the efficiency of the output element (be it a grating or other element, such as a beam splitter or holographic optical element) can be adjusted by adding a layer of dielectric material to the outcoupling region. If outcoupling efficiency is too high, a high threshold current is required to lase because of the quantity of photons escaping the cavity. With a reflective layer atop the outcoupling grating, some of the light is reflected and continues to oscillate within the cavity. This has the effect of marginally decreasing the required current for lasing. Adding a dielectric layer (for example, nitride, or a dielectric stack, or even a reflective metallic layer) to the outcoupling location therefore controls outcoupling loss and decreases the required threshold current.

In any configuration of the present application where one or more gratings are located and superimposed on one another, the separate gratings can be individually formed by conventional means (including multiple exposures and etches to form the pattern) or can be merged into a single element using a holographic optical element (HOE). The optical requirements of the gratings can be calculated, and a HOE can be designed that accomplishes these required optical functions. Once designed, such a HOE can be patterned for lithography, and can therefore be fabricated in fewer process steps than it would take to create the multiple gratings separately. For example, multiple divergent beams can be captured and coupled into a single fiber with HOEs.

Figure 3:
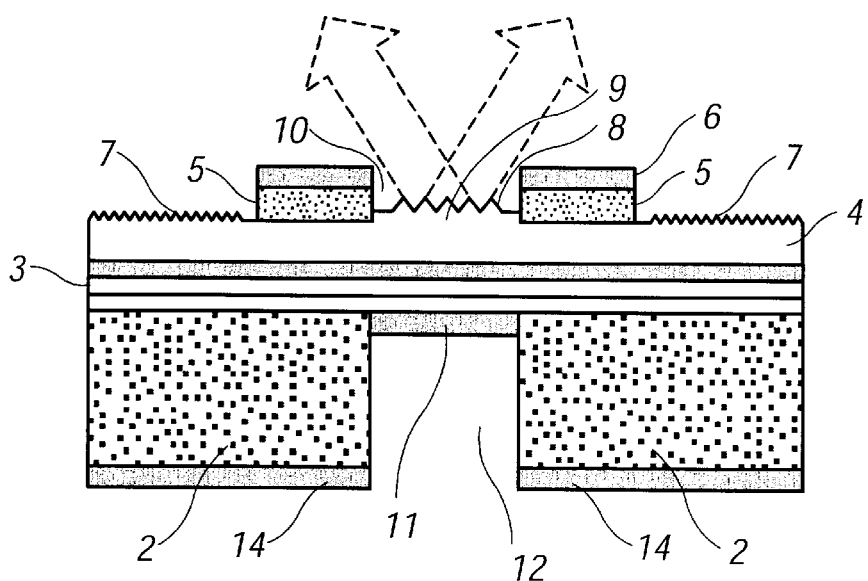
FIG. 3 shows a side view of a DBR laser with a reflective undercoating to reflect laser light.

In another embodiment, shown in FIG. 3, a reflecting surface is placed beneath the outcoupling gratings. This surface 11 reflects the two lower lobes of emitted light. This reflective layer can be made from a metallic substance or other material reflective to the necessary wavelengths of light, or it might be a reflective grating formed in the device, for example. By coupling the lower lobes back up and out of the OC grating, greater power is coupled out of the laser and may be captured by a fiber or other device, such as a detector to monitor the light produced by the device. A space 12 is shown in the substrate of the figure, but the same reflective surface can be placed with the substrate intact.

Figure 4A:
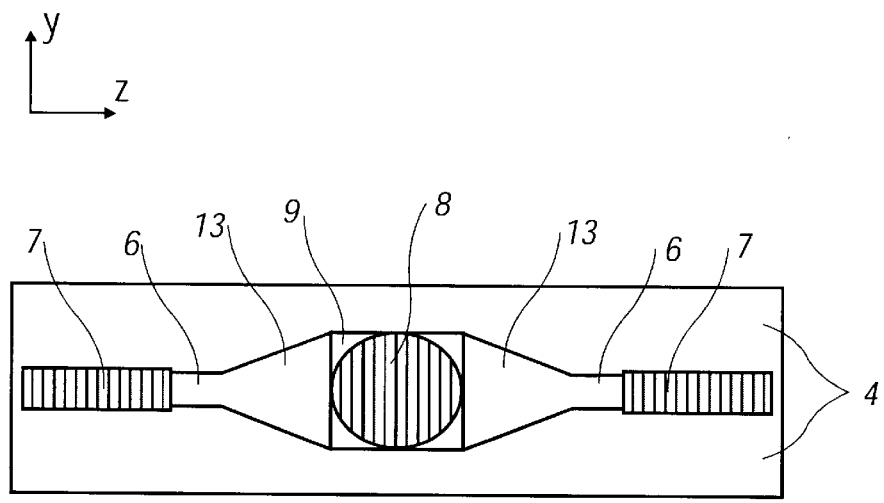
FIG. 4a shows a top view of a DBR with flared or tapering gain regions.

Another embodiment is shown in FIG. 4a, which shows a method to increase the lateral width of the gain regions at the outcoupling grating while maintaining a single-transverse mode. This is accomplished by using a single mode waveguide in the gain region that connects to a tapered gain region. The taper angle is related to the divergence of the fundamental mode of the single mode waveguide. In the preferred embodiment, the tapered regions have a laterally varying current contact, such as a gaussian contact to stabilize the modes in the tapered device.

The embodiment shown in FIG. 4a has a tapered gain region 13. The gain region in this sample has a straight portion as well. Different contacts are used in the preferred embodiment, pumping the different regions with increasing current as necessary. The tapered gain region ensures a wide-spatially-coherent mode, and avoids the restriction on the lateral (y) dimension imposed by the requirement of single lateral mode operation. A wide lateral mode allows the width of the output beam to be set by the width of the grating. The grating area can take a desired shape to match the needs of various applications. For example, circular, elliptical, or Gaussian beams can be produced.

Figure 4B:
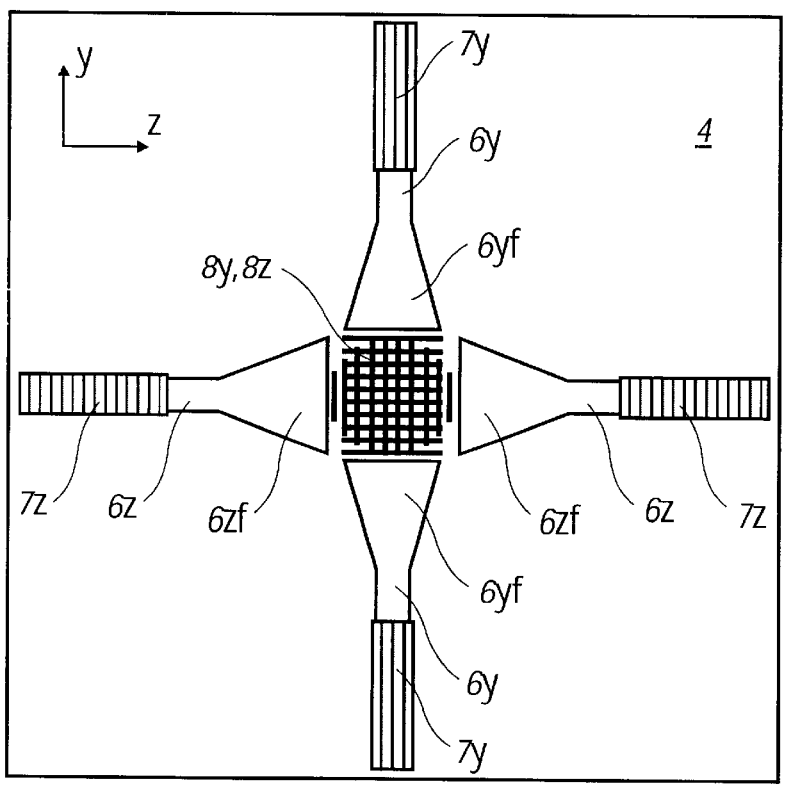
FIG. 4b shows a top view of crossed DBRs each with flared or tapered gain regions.

FIG. 4b shows the tapered gain regions used with multiple crossed grating outcoupled lasers. This embodiment shows two crossed GO (grating outcoupled) lasers at 90 degrees to one another. DBR gratings 7y, 7z, create the cavity as in other embodiments discussed above. The pumped regions of the lasers in this variation have a flared section (labeled with the f suffix), being wider closer to the OC gratings. In this example, one laser has an outcoupling grating that is circular in shape, while the other laser has an outcoupling grating that is rectangular. Using a tapered gain region, outcoupled beams of a greater range of sizes can be produced, as the gain region can be made to whatever width is necessary to accommodate (or fully take advantage of) the size of the OC grating. Tapered gain regions also increase the total amount of emitted power from the device.

Figure 5A:
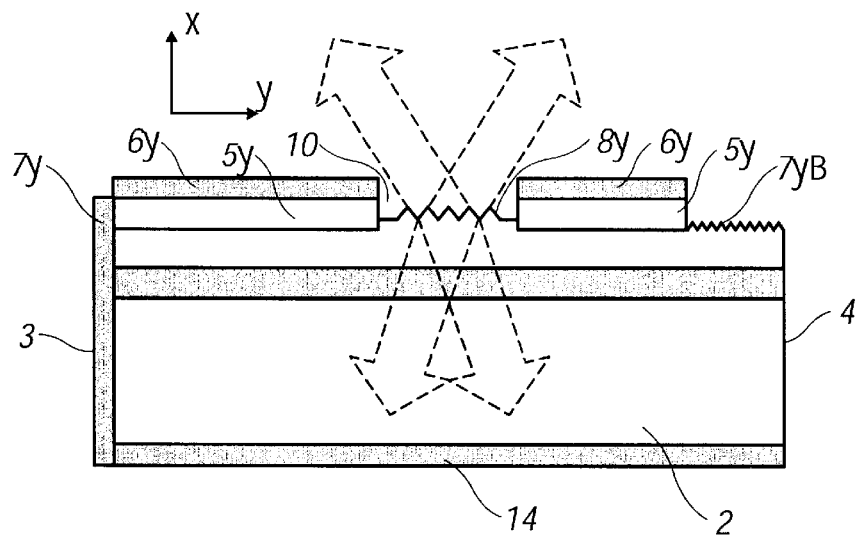
FIG. 5a shows a side view of a laser diode having a DBR at one end and a cleaved facet at the other end.

Another embodiment is shown in FIG. 5a. At one end of the laser, the DBR has been replaced by a reflective end facet 7y. There are still two gain region portions, separated by the OC grating in this embodiment. The other end of the laser has a DBR 7yB, the period of which determines the wavelength that will be stable in the cavity.

Figure 5B:
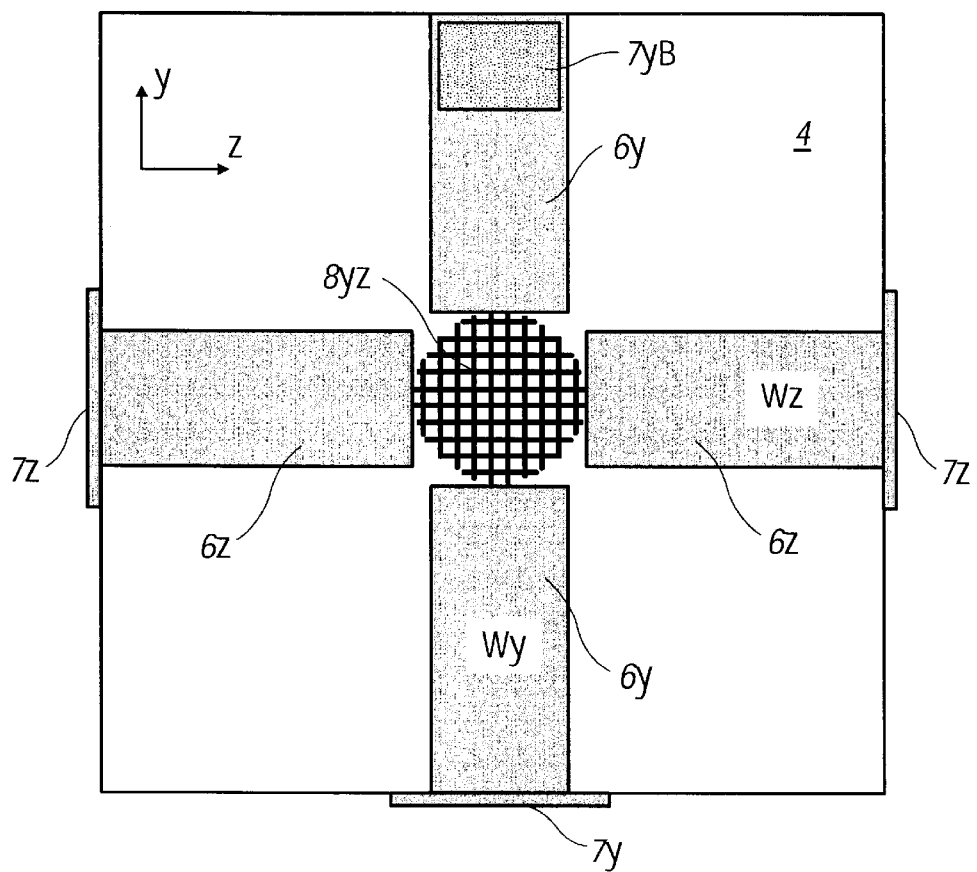
FIG. 5b shows a top view of crossed lasers, using both DBRs and reflecting facets.

A top view of a crossed GO laser system is shown in FIG. 5b. In this variation, the laser running in the z-direction (horizontal in the figure) has reflective end facets on both ends, and no DBRs for reflecting the light in the cavity. The y-direction laser (vertical in the figure) has a DBR at one end, and a reflective facet at the other end. Cleaved facet ends reduce the length of the device since the length of the DBR sections is omitted.

Figure 5C:
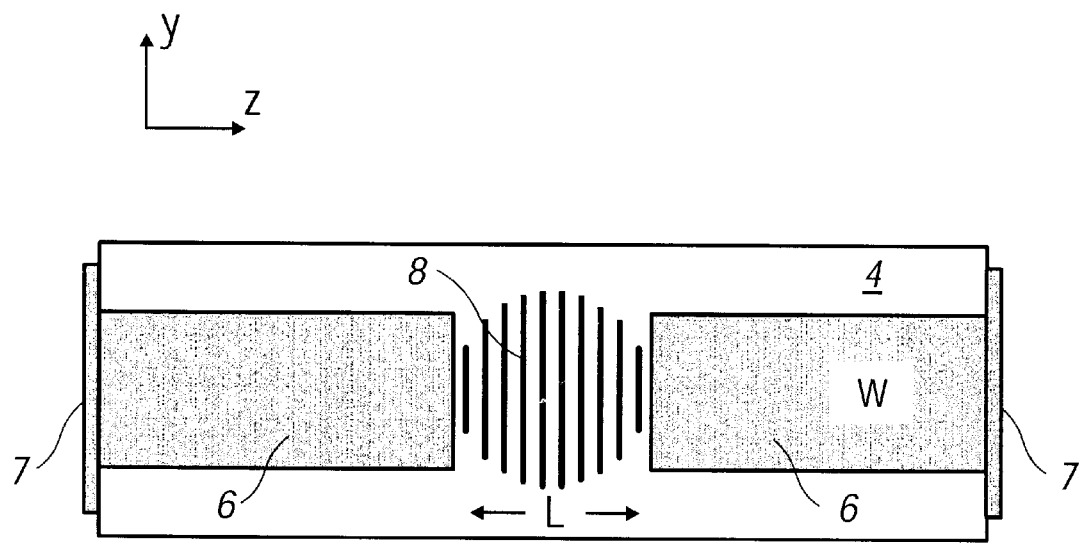
FIG. 5c shows a top view of a laser diode using cleaved facets.

FIG. 5c shows a top view of a laser diode with cleaved facets at both ends. The length of the gain region is fixed by the reflectivity of the end facets or the DBRs.

Figure 6:
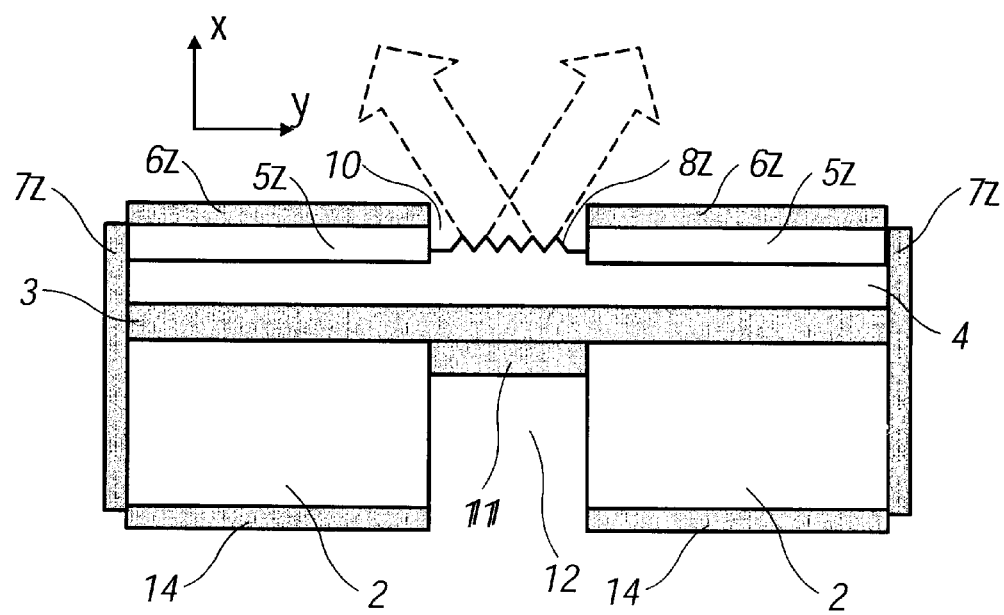
FIG. 6 shows a laser diode using cleaved facets and a reflective layer beneath part of the waveguide.

FIG. 6 shows a laser with two reflective end facets and an OC grating between the pumped regions. Beneath the OC grating is a reflector for reflecting the two downward directed beams back up toward the surface of the laser. Capturing the downward beams is useful to increase efficiency.

Figure 7A:
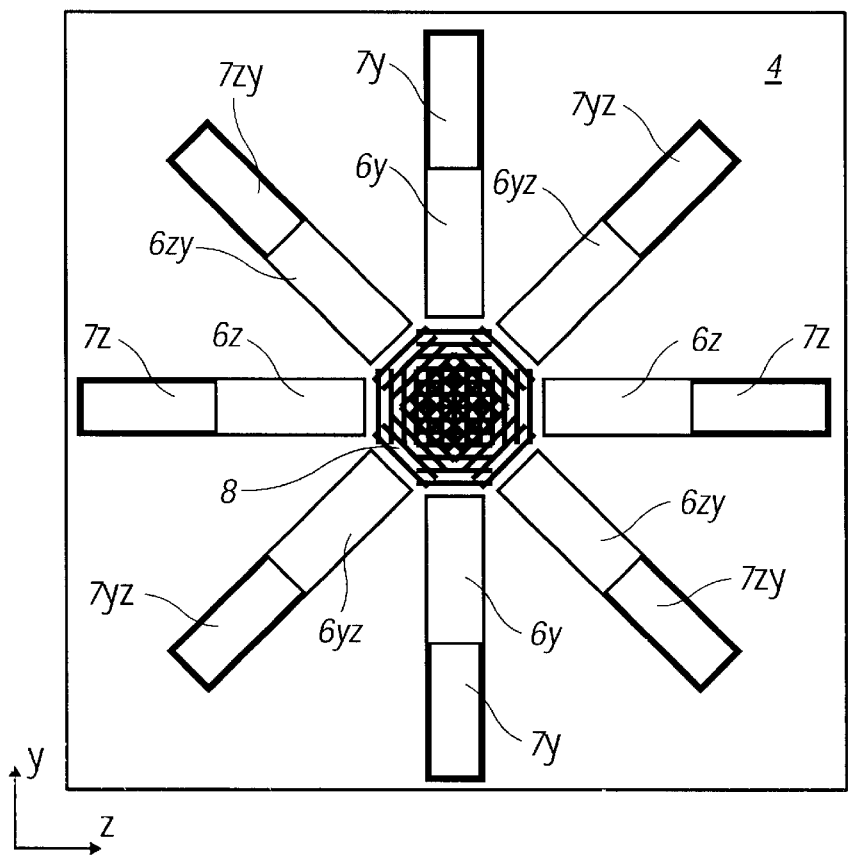
FIG. 7a shows a top view of four crossed DBR lasers each outcoupling light through the same outcoupling element.
Figure 7B:
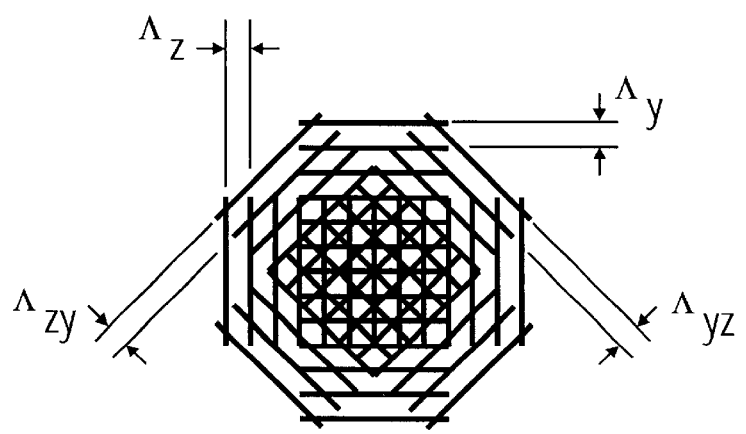

FIG. 7a shows a GO laser system with four crossed lasers being outcoupled at the same spatial location. Distributed Bragg reflectors are shown in this example at each end of the individual lasers. Each laser has its own OC grating superimposed on the other OC gratings to create one virtual grating. (Note that it is possible to overlap the gratings in different planes, having either curved waveguides or making each laser totally in a different plane than the others, but this is a less preferred embodiment. HOEs can be used in place of multiple gratings in such a situation.) FIG. 7b shows a close-up of the outcoupling gratings for the four laser system. There are four gratings, each at a 45 degree angle to the adjacent gratings. The periods of these gratings need not be the same, which allows the use of multiple wavelengths being outcoupled at the same location (assuming the lasers themselves are fashioned to output different wavelengths). The periods of the various gratings are labeled as Lz, Ly, Lzy, and Lyz.

The structure of the grating outcoupled laser allows for the high-level integration of electronic circuitry with the laser device. Many different possible devices can be integrated with the GO laser of the present application, including control electronics and photonic integrated circuits that can be placed on the chip with the laser; electronic integration includes higher level data management electronics such as serialization/deserialization, clock generation and recovery, op amps and analog-to-digital and digital-to-analog converters. The GO laser geometry is also advantageous in that it allows for integration with optical waveguides and integration of light routing circuitry on the chip. Such photonic integration allows optical interconnects between circuit elements, integration of optical isolators, wavelength tunable sections, optical modulators, waveguide couplers, waveguide switches, and simultaneous integration of multiple ones of these components.

Figure 12:
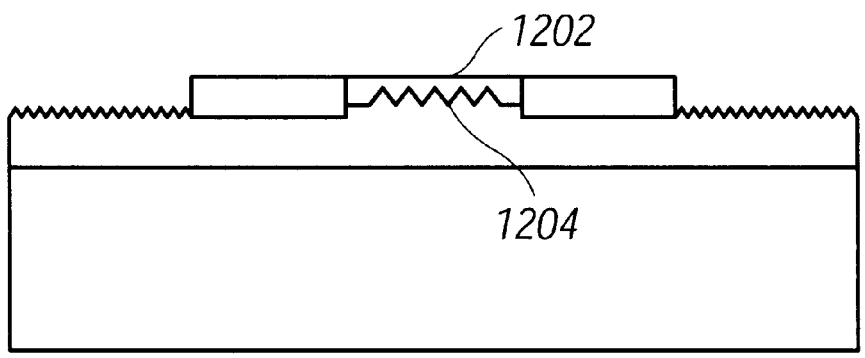
FIG. 12 shows another embodiment of the present application.

FIG. 12 shows another embodiment of the present innovations. In this variation, a reflective coating 1202 (for example, a dielectric stack or a metal layer) is placed on top of the device, where the outcoupling grating 1204 is located. This reflective coating causes the light to be coupled through the bottom of the device. (Note that it is often useful to allow some light to escape the top of the device in this design, as this light can be used to allow easier wafer level probe testing of the device.) If an outcoupling grating is used without such a reflective coating, there is of course light emitted both above and below the waveguide due to reflection from the grating. The reflective coating causes the top emitted lobe of light to instead be emitted through the bottom of the device, so that substantially all light emitted from the cavity is coupled out through the substrate material, which is a transparent material, usually about 100 microns thick. The reflective coating can be metallic (such as gold) or it can be a dielectric stack for better reflection. Generally, if the light is to be emitted out the bottom of the device, a high reflect (HR) coating is placed on top of the device to reflect the light downward. An anti-reflect (AR) coating may be added to the bottom of the device in this case. Alternatively, if the light is to be emitted out the top surface, the HR coating may be placed on the bottom of the device, and an AR coating placed on top.

Causing the light to be emitted through the bottom of the device has the advantage of allowing the heat sink to be placed on the top of the laser, closer to the locations where heat is generated, increasing efficiency of heat sinking. In such a case, the device is preferably mounted "upside down", with the reflective coating and DBRs beneath, the substrate on top, facing a fiber core for coupling, for example. This variation helps feedback in the cavity and can decrease threshold current by 50% or more.

In FIG. 12, the laser device is shown with an outcoupling aperture between the DBRs. An outcoupling grating is shown in this example. On top of this grating is located a reflective coating that directs outcoupled light down through the substrate.

Figure 13:
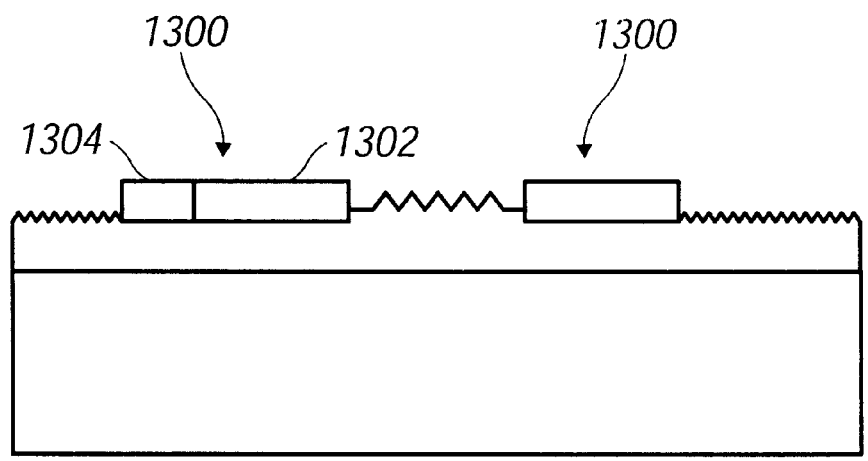
FIG. 13 shows another embodiment of the present application.

The gain region or regions of the present innovations can be modified to provide added functionality. FIG. 13 shows a DBR laser according to an embodiment of the present innovations. The gain region 1300 has multiple parts in this example, one on either side of an outcoupling grating. One part of the gain region is further split into two parts, a larger 1302 and a smaller 1304 section. The smaller part, which can be used to more sensitively adjust the current supplied to the gain region, is used for several purposes. It can be used as a fine tuning device for the wavelength of the light in the cavity. By increasing or decreasing the current, the wavelength can be slightly tuned to some degree. The smaller contact can also be used to modulate the signal generated in the cavity. By varying the supplied current over time, the intensity of the emitted light can be varied. This can be used to modulate the signal by adjusting the current over time to alter the intensity of light, and thus embed a signal in the emitted light. The smaller contact is the preferred one to use for such modulation, since it will allow faster modulation (due to lower capacitance, etc.).

Figure 14:
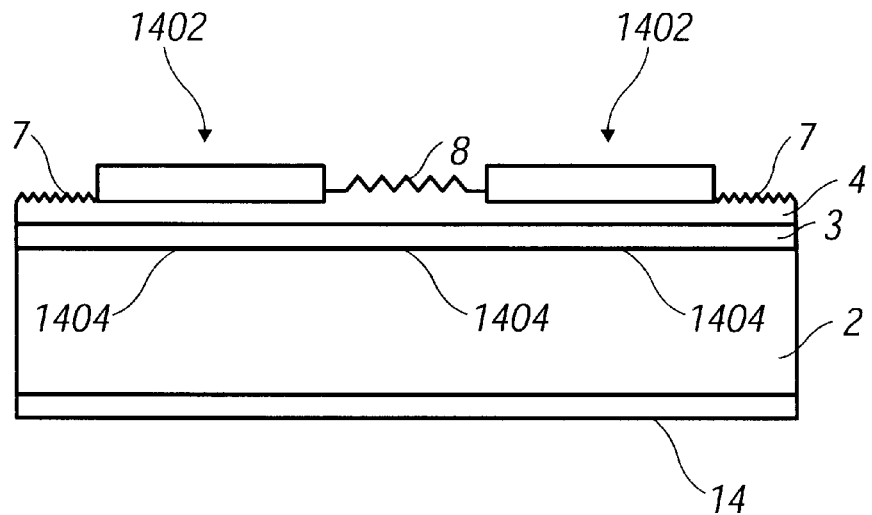
FIG. 14 shows a DBR laser with thinned quantum wells beneath the outcoupling grating and beneath the DBRs.

FIG. 14 shows a side view of a DBR laser according to another embodiment. The laser has a cavity and two reflector gratings 7, one at each end. Between the reflector gratings are the gain region 1402 and the outcoupling grating 8.

The waveguide 3 in the laser may be made from multiple layers including an active and guiding layer containing the junction between the p and n type semiconductor materials. For example, this region might comprise a sequence of one or more barrier layers alternating with quantum well layers.

In the embodiment shown in the figure, the quantum wells 1404 are made thinner beneath the reflector gratings 7 and beneath the outcoupling grating 8. This results in a less lossy, more transparent device. The larger bandgap in the thinner quantum well regions (i.e., in the unpumped regions) means less absorption of photons in the cavity because higher photon transition energy is required. This lowers internal loss, increases efficiency, and lowers the required threshold current for the device.

The quantum well thickness, by controlling the required transition energy, affects the wavelength of the photons that will lase in the cavity. This allows large scale tunability of the device during fabrication by controlling quantum well formation.

Quantum wells are fabricated at different thicknesses using selective growth of epitaxial layers. This selective growth phase of processing can also be used to simultaneously improve the performance of integrated components such as electro-absorption modulators, which benefit from quantum well structures that can be made more transparent (or have a higher photon transition energy). The integrated devices are fabricated at the same time and during the same set of processes as the lasers themselves, and selective growth can be used on them without significant process cost added.

Figure 15:
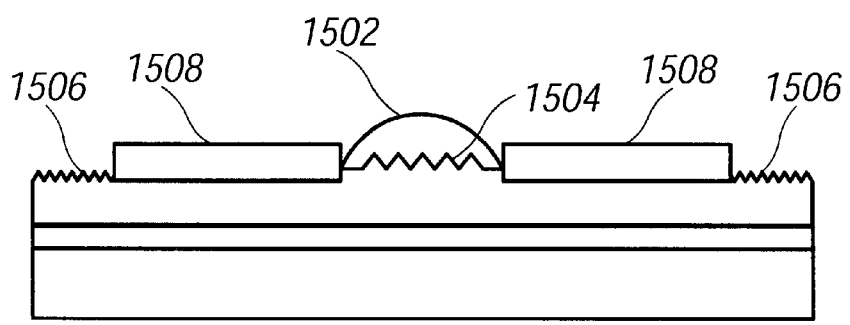
FIG. 15 shows another laser embodiment.

FIG. 15 shows another embodiment. In this variation, a fractional-spherical lens 1502 made of an optical polymer is formed on the outcoupling grating 1504 (by a microjet process, for example). This lens acts to make different wavelengths of light (which may exit the OCG at different angles than the normal, or from one another) converge to be coupled into a fiber mode, for example. Since the index of refraction of the material outside the lens is lower than the index of refraction of the lens, light rays passing through the lens to the lower index material will be refracted away from the normal to the surface of the lens at that point. Depending on the index difference, the refraction can be great or small. This element can be used to allow design margin in the size of the outcoupling grating. With the added lens, the outcoupling grating can be made larger, (50 microns, for example), which is useful in high power applications. Normally, an outcoupling grating of 10 micron size can outcouple light in the hundreds of milliwatt range or higher, but with larger outcoupling gratings light of higher power, well above a watt, can be outcoupled and confined to a fiber mode.

Other types of intermediate lens devices (gratings, HOEs, etc.) can also be used at this location to aid in coupling light from the outcoupling grating into a fiber core (for example). Such devices can be made on chip, or be separate devices added after processing is complete.

FIG. 15 shows a sample embodiment of the device. This embodiment comprises a DBR laser as described previously in this application, with outcoupling grating 1504 located between the two reflector gratings 1506. Gain regions 1508 are on either side of the OCG. A lens 1502 which is partly spherical in shape is formed on the outcoupling grating.

Details and Alternatives for Electronic Device Design and Fabrication

The most straightforward way to achieve integration of the electronic and photonic device structures is simply to provide the appropriate epitaxial structures for both. This can be done, for example, by using a stacked-epi structure, where the epitaxial layers for the electronic devices are simply grown over the epitaxial layers for the lasers (and possibly other photonic devices). In this class of embodiments, growth of the conventional epitaxial structures for transistors (e.g. a lightly-doped GaAs layer adjacent to a more-heavily-doped AlGaAs layer, in a conventional HEMT structure) is simply performed after the growth of the quantum-well structures for the lasers. A masked etch can be used to remove the electronic device layers from the laser locations, or alternatively a selective or masked growth process can be used.

An alternative embodiment, which is contemplated as advantageous for future use, is to share at least some parts of the epitaxial structures for both electronic and photonic components. This has the advantage of reducing the thermal budget during epitaxial growth (and also reducing cost), but is more complex to implement.

A further alternative is to form layers for the photonics structures over the epitaxial (or substrate) layers which are used for the electronic devices.

Definitions

Following are short definitions of the usual meanings of some of the technical terms which are used in the present application. (However, those of ordinary skill will recognize whether the context requires a different meaning.) Additional definitions can be found in the standard technical dictionaries and journals.

Chirped Grating: a grating whose period varies over its area;
DBR: Distributed Bragg Reflector;
DFB: Distributed Feedback (Laser);
DWDM: Dense Wavelength Division Multiplexing;
GO: Grating Outcoupled (Laser);
HOE: Holographic Optical Element;
LED: Light Emitting Diode;
LD: Laser Diode
Modulate: any controlled variation of the signal, in intensity or frequency or phase;
OCG:Outcoupling Grating;
VCSEL: Vertical Cavity Surface Emitting Laser;
Waveguide: a structure which guides the propagation of photons, usually by internal reflection.

According to a disclosed class of innovative embodiments, there is provided: An electronic/photonic integrated circuit, comprising: a plurality of lasers having lateral cavities; at least one grating positioned to outcouple light from at least one said laser; at least one lateral waveguide which is optically coupled to be driven by at least one said laser; and electronic circuitry including at least one transistor which is formed from a body of material which is common to at least one said laser.

For example, the body of material can ultimately be not continuous between said laser and said transistors.

For example, each said laser can have a cavity which is defined solely by a distributed reflector.

For example, the semiconductor structure can be epitaxially grown on a substrate which consists essentially of monocrystalline InP.

For example, the body of material can comprise multiple substantially lattice-matched layers of III-V compound semiconductor material.

According to another disclosed class of innovative embodiments, there is provided: An electronic/photonic integrated circuit, comprising: a laser comprising at least one semiconductor gain volume, distributed reflector gratings defining a laser cavity beam path through said gain volume, and an outcoupling grating which deflects a portion of the energy in said beam path out of the plane of said reflector gratings; and transistors which are electrically coupled to said laser; wherein said transistors and said gain volume are formed in a single multilayer structure of semiconductor material.

According to another disclosed class of innovative embodiments, there is provided: An electronic/photonic integrated circuit, comprising: at least one GSE laser; and at least 10,000 transistors, formed in a semiconductor structure which is at least partly shared with said laser.

According to another disclosed class of innovative embodiments, there is provided: A method for fabricating electronic/photonic integrated circuits, comprising the actions of: forming transistors and lateral-cavity lasers in a single body of monocrystalline semiconductor material; and forming gratings which outcouple light from at some ones of said lasers, to thereby form grating-outcoupled surface-emitting lasers; forming electrical connections to said transistors and said lasers; and forming lateral waveguides which provide optical interconnects to at least some ones of said lasers.

According to another disclosed class of innovative embodiments, there is provided: A method for fabricating electronic/photonic integrated circuits, comprising the actions of: forming transistors and lateral-cavity lasers in a single body of monocrystalline semiconductor material; forming gratings which outcouple light from at some ones of said lasers, to thereby form grating-outcoupled surface-emitting lasers; said lasers also comprising distributed reflectors having a different period than said gratings; and forming electrical connections to said transistors and said lasers.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

The device structures used for the electronic circuitry can be HEMTs, or alternatively HBTs, MESFETs, MOSFETs, gain diodes, or other structures.

In one class of embodiments, epitaxial layers are separately optimized for the optical emission structures and for the channel portions of the transistor structures. In one such example, the semiconductor layer which overlies the quantum well(s) of the laser structures is used as the body for a HEMT (or as the emitter for an emitter-down HBT), and the channel (or base) and barrier (or collector) layers are successively formed thereover.

In an alternative class of embodiments, the SAME layer which is used for the gain volume of the laser structures is used as a channel (or base, or more generally "conductivity-control") volume for the active semiconductor devices. This can be accomplished in several ways:

In one alternative, the laser structure can simply be a single-well structure.

In another alternative, a multi-quantum-well laser structure can be used as the channel of a HEMT; even if inversion does not occur below the top layer of the narrowest-bandgap material, switchable modulation of one layer's conductivity is sufficient for operation of the device.

In another alternative, a disordering treatment (local transient heating, diffusion or neutral implant) can be applied to the device areas, to smoothe out the vertical changes in composition which provide the multiple quantum wells for the laser's gain volume.

The electronic circuitry is not limited to switching and driver circuits, but can also include, for example, imagers, detectors, DRAMs (transistor with capacitor), SRAMs, gate arrays, microprocessors, or anything else normally done in silicon or in III–V technologies.

The above list of alternatives is not exhaustive, and various other standard techniques used for microfabrication of lasers and/or integrated circuits can be used as well.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

What is claimed is:

1. An electronic/photonic integrated circuit, comprising:

a plurality of lasers having lateral cavities;

at least one grating positioned to outcouple light from at least one said laser;

at least one lateral waveguide which is optically coupled to be driven by at least one said laser; and electronic circuitry including at least one transistor which is formed from a body of material which is common to at least one said laser.

2. The integrated circuit of claim 1, wherein said body of material is ultimately not continuous between said laser and said transistors.

3. The integrated circuit of claim 1, wherein each said laser has a cavity which is defined solely by a distributed reflector.

4. The integrated circuit of claim 1, wherein said semiconductor structure is epitaxially grown on a substrate which consists essentially of monocrystalline InP.

5. The integrated circuit of claim 1, wherein said body of material comprises multiple substantially lattice-matched layers of III–V compound semiconductor material.

6. An electronic/photonic integrated circuit, comprising:

a laser comprising
at least one semiconductor gain volume,
distributed reflector gratings defining a laser cavity beam pat through said gain volume, and
an outcoupling grating which deflects a portion of the energy in said beam path out of the plane of said reflector gratings; and transistors which are electrically coupled to said laser;
wherein said transistors and said said volume are formed in a single multilayer structure of semiconductor material.

7. The integrated circuit of claim 6, wherein said structure is not continuous between said laser and said transistors.

8. The integrated circuit of claim 6, wherein said semiconductor structure is epitaxially grown on a substrate which consists essentially of monocrystalline InP.

9. The integrated circuit of claim 6, wherein said body of material comprises multiple substantially lattice-matched layers of III–V compound semiconductor material.

10. An electronic/photonic integrated circuit, comprising:
at least one GSE laser; and
at least 10,000 transistors, formed in a semiconductor structure which is at least partly shared wit said laser.

11. The integrated circuit of claim 10, wherein said semiconductor structure is not continuous between said laser and said transistors.

12. The integrated circuit of claim 10, wherein each said laser has a cavity which is defined solely by a distributed reflector.

13. The integrated circuit of claim 10, wherein said semiconductor structure is epitaxially grown on a substrate which consists essentially of monocrystalline InP.

14. The integrated circuit of claim 10, wherein said body of material comprises multiple substantially lattice-matched layers of III–V compound semiconductor material.

* * * * *

UNITED STATES PATENT AND TRADEMARK OFFICE
CERTIFICATE OF CORRECTION

PATENT NO.   : 6,661,825 B2  
DATED        : December 9, 2003  
INVENTOR(S)  : Evans et al.

It is certified that error appears in the above-identified patent and that said Letters Patent is hereby corrected as shown below:

Column 16,  
Line 5, after "beam", delete "pat" and insert -- path --.  
Line 10, after "transistors and said", delete "said".  
Line 24, after "shared", delete "wit" and insert -- with --.

Signed and Sealed this

Third Day of February, 2004

JON W. DUDAS  
*Acting Director of the United States Patent and Trademark Office*